United States Patent
Chung et al.

(10) Patent No.: US 7,969,024 B2
(45) Date of Patent: Jun. 28, 2011

(54) SEMICONDUCTOR PACKAGE WITH JOINT RELIABILITY, ENTANGLED WIRES INCLUDING INSULATING MATERIAL

(75) Inventors: Hyun-soo Chung, Hwaseong-si (KR); Jae-shin Cho, Yongin-si (KR); Seong-deok Hwang, Seoul (KR); Jum-gon Kim, Suwon-si (KR); Ki-hyuk Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 52 days.

(21) Appl. No.: 12/453,103

(22) Filed: Apr. 29, 2009

(65) Prior Publication Data
US 2009/0315177 A1 Dec. 24, 2009

(30) Foreign Application Priority Data
Jun. 24, 2008 (KR) .................. 10 2008 0059780

(51) Int. Cl.
*H01L 23/48* (2006.01)
*H01L 23/52* (2006.01)
(52) U.S. Cl. ......... 257/784; 257/737; 257/738; 257/780
(58) Field of Classification Search .................. 257/784, 257/737, 738, 780
See application file for complete search history.

(56) References Cited

U.S. PATENT DOCUMENTS

| | | | |
|---|---|---|---|
| 6,215,670 B1* | 4/2001 | Khandros | 361/774 |
| 6,489,182 B2* | 12/2002 | Kwon | 438/110 |
| 2001/0026954 A1* | 10/2001 | Takao | 438/106 |
| 2005/0040540 A1* | 2/2005 | Haba et al. | 257/778 |
| 2005/0064740 A1* | 3/2005 | Brodsky et al. | 439/66 |
| 2005/0098891 A1* | 5/2005 | Wakabayashi et al. | 257/758 |
| 2007/0085220 A1* | 4/2007 | Hortaleza | 257/780 |
| 2009/0315177 A1* | 12/2009 | Chung et al. | 257/737 |

FOREIGN PATENT DOCUMENTS

| | | |
|---|---|---|
| KR | 10-0422346 | 2/2004 |
| KR | 10-0444163 | 8/2004 |
| KR | 10-0596766 | 6/2006 |

OTHER PUBLICATIONS

An English language abstract of Korean Publication No. KR 10-2001-4085, published Jan. 15, 2001.
An English language abstract of Korean Publication No. KR 10-2002-94593, published Dec. 18, 2002.
An English language abstract of Korean Publication No. 10-2003-56220, published Jul. 4, 2003.

* cited by examiner

*Primary Examiner* — Teresa M Arroyo
(74) *Attorney, Agent, or Firm* — Harness, Dickey & Pierce, PLC

(57) ABSTRACT

A semiconductor package with improved joint reliability and a method of fabricating the semiconductor package are disclosed. A conductive connector may be formed on a surface of a semiconductor wafer on which semiconductor devices may be arranged. A first insulating layer including a first opening through which a portion of the connection pad is exposed may be formed on the connection pad and the semiconductor wafer. A rewiring line electrically connected to an exposed portion of the connection pad may be formed on the first insulating layer. A second insulating layer including a second opening through which a portion of the rewiring line is exposed may be formed on the rewiring line and the first insulating layer. A connection terminal including one or more entangled wires may be formed on an exposed portion of the rewiring line so as to be electrically connected to the rewiring line.

19 Claims, 11 Drawing Sheets

SEMICONDUCTOR PACKAGE WITH JOINT RELIABILITY, ENTANGLED WIRES INCLUDING INSULATING MATERIAL

PRIORITY STATEMENT

This application claims priority under 35 U.S.C. §119 to Korean Patent Application No. 10-2008-0059780, filed on Jun. 24, 2008, in the Korean Intellectual Property Office (KIPO), the entire contents of which are incorporated herein by reference.

BACKGROUND

1. Field

Example embodiments are directed to semiconductor packages, and more particularly, to semiconductor packages with improved joint reliability.

2. Description of the Related Art

Semiconductor packages connect an input/output terminal of a chip to an external device, and simultaneously protect the chip. As semiconductor devices are manufactured to have smaller sizes and higher performances, inexpensive semiconductor packages with improved reliability are required. To meet this need, flip chip packages, wafer level packages, and wafer level stack packages, which do not require wire bonding, have been developed.

In a wafer level package, semiconductor chips are assembled or packaged in a single wafer operation prior to separating the chips, unlike conventional lead frame packages. Therefore, the packaging processes may be performed simultaneously, allowing the assembly operation for all semiconductor chips disposed on a wafer to be finished at the same time. As a result, the manufacturing cost of each semiconductor device may be reduced, while allowing the functions of the semiconductor package and chip to be completely integrated. In addition, the size of a semiconductor package may be reduced to almost match the size of a semiconductor chip, a reduction over other packaging technologies (e.g. lead frame packaging).

Further, a conventional lead frame package uses leads as external connection terminals, with the leads being one-dimensionally disposed around the edge of a semiconductor chip. In contrast, a wafer level package allows solder balls, disposed throughout the lower surface of the package, to function as external connection terminals. Thus, external connection terminals may be effectively arranged in the wafer level package.

However, in wafer level packaging, because a semiconductor chip is directly connected to the substrate of a printed circuit board through solder balls, cracks are generated at solder joints due to a mismatch in the coefficient of thermal expansion (CTE). This mismatch causes pressure and tensile stress between the substrate and the solder ball, generating cracks at the solder ball joints in response to temperature changes, for example, during thermal processing.

SUMMARY

Example embodiments disclose a semiconductor package with improved joint reliability.

According to example embodiments, a semiconductor package including a connection terminal is disclosed. The connection terminal of the semiconductor package may include one or more entangled wires.

According to example embodiments, a semiconductor package is disclosed. A first conductive connector may be on a surface of a semiconductor wafer. A first insulating layer may be on the first conductive connector and the semiconductor wafer and may include a first opening through which a portion of the first conductive connector is exposed. A rewiring line may be on the first insulating layer and conductively connected to an exposed portion of the first conductive connector. A second insulating layer may be on the rewiring line and the first insulating layer and may include a second opening through which a portion of the rewiring line is exposed. The connection terminal may be on an exposed portion of the rewiring line and conductively connected to the rewiring line, for example, electrically connected. The first conductive connector may be a connection pad. The rewiring line may include a solderable material. The rewiring line may include one of Ag, Au and Ni.

The rewiring line may include: a lower rewiring layer on the first insulating layer and connected to the exposed portion of the first conductive connector; and an upper rewiring layer on the lower rewiring layer. The lower rewiring layer may be an adhesive layer (e.g., Ti and/or Cu). The upper rewiring layer may include a solderable material (e.g., Ag, Au and/or Ni).

According to example embodiments, a semiconductor package is disclosed. A first conductive connector may be on a surface of a semiconductor wafer on which semiconductor devices may be arranged. A first insulating layer may be on the first conductive connector and the semiconductor wafer. The first insulating layer may include a first opening through which a portion of the first conductive connector is exposed. A rewiring line may be on the first insulating layer and may be electrically connected to an exposed portion of the first conductive connector. A second insulating layer may be on the rewiring line and the first insulating layer, and may include a second opening through which a portion of the rewiring line is exposed. A second conductive connector may be on the rewiring line, wherein a portion of the second conductive connector may be exposed through the second opening. A portion of the second conductive connector may be between the connection terminal and the rewiring line and the connection terminal may be conductively connected to the rewiring line. The second conductive connector may include a solderable material (e.g., Ag, Au and/or Ni). One or more entangled wires may be disposed on, and electrically connected to, a portion of the second conductive connector. The one or more entangled wires may be part of a connection terminal. The first and second conductive connectors may be connection pads.

The rewiring line may include: a lower rewiring layer on the first insulating layer and connected to the exposed portion of a first conductive connector; and an upper rewiring layer on the lower rewiring layer. The lower rewiring layer may be an adhesion layer (e.g., Ti and/or Cu). The upper rewiring layer may or may not be solderable (e.g., Au, Ag, Cu, and/or Ni).

The connection terminal may include a wire ball including the one or more entangled wires made of a conductive material and/or coated with a conductive material, and/or the connection terminal may include a wire bump in which the one or more entangled wires are embedded. The one or more entangled wires may include, for example, a metal, resin, or ceramic material. The conductive material may include a solderable material, and/or the wire bump may include a solderable material (e.g., Ag, Au or Ni). The connection terminal may include a plurality of entangled wires. The plurality of entangled wires may be individually entangled or two or more of the plurality of wires may be entangled with each other. Two or more of the plurality of entangled wires may be both individually entangled and entangled with each other.

Two or more of the plurality of wires may be individually entangled, entangled with each other, or individually entangled and entangled with each other.

According to example embodiments, a connection terminal of a semiconductor package including one or more entangled wires is disclosed. The one or more entangled wires may include a metal, resin or ceramic material. The connection terminal may include a wireball including one or more entangled wires coated with a conductive material. The conductive material may include a solderable material. The connection terminal may include a wire bump in which one or more entangled wires are imbedded. The wire bump may include a solderable material (e.g., Ag, Au and/or Ni).

According to example embodiments, a connection terminal of a semiconductor package is disclosed. The connection terminal may include a plurality of entangled wires. The plurality of entangled wires may be individually entangled or two or more of the plurality of wires may be entangled with each other. Two or more of the plurality of entangled wires may be both individually entangled and entangled with each other. Two or more of the plurality of wires may be individually entangled, entangled with each other, or individually entangled and entangled with each other.

According to example embodiments, a method of fabricating semiconductor packages is disclosed. A first conductive connector may be formed on the surface of a semiconductor wafer on which semiconductor devices may be arranged. A first insulating layer, including a first opening through which a portion of the first conductive connector is exposed, may be formed on the first conductive connector and the semiconductor wafer. A rewiring line electrically connected to an exposed portion of the first conductive connector may be formed on the first insulating layer. A second insulating layer including a second opening through which a portion of the rewiring line is exposed may be formed on the rewiring line and the first insulating layer. According to example embodiments, a connection terminal including one or more entangled wires may be formed on an exposed portion of the rewiring line. According to example embodiments, a connection terminal including one or more entangled wires may be formed on a second conductive connector formed on the rewiring line. The connection terminal may permeate into the rewiring line and/or the second conductive connector when using a reflow process.

BRIEF DESCRIPTION OF THE DRAWINGS

Example embodiments will be more clearly understood from the following brief description taken in conjunction with the accompanying drawings. FIGS. 1-10 represent non-limiting, example embodiments as described herein.

FIGS. 1-4 are cross-sectional views of semiconductor packages according to example embodiments;

FIGS. 9-10 are cross-sectional views of semiconductor packages according to example embodiments.

Figure 1:
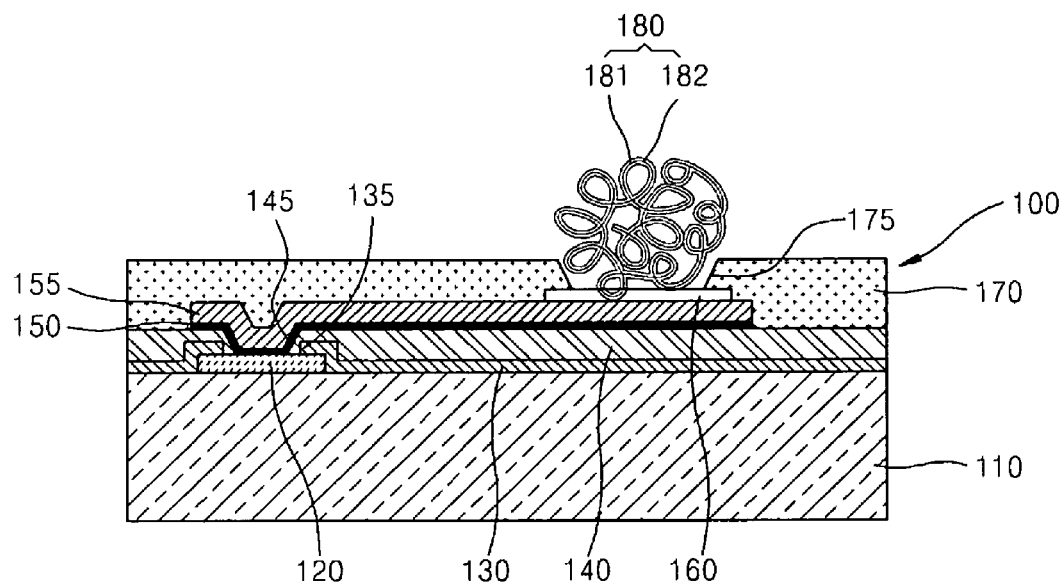

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a cross-sectional view of a wafer level semiconductor package according to example embodiments. Referring to FIG. 1, the wafer level semiconductor package may include a semiconductor chip 100 and a connection terminal 180. The semiconductor chip 100 may include a connection pad 120 formed on a surface of a wafer 110. Semiconductor devices (not shown) may be integrated on the surface of the wafer 110. The connection pad 120 may conductively connect the semiconductor devices to external devices, and may be, for example, an electrically conductive metal pad (e.g. an Al pad). As used throughout, a "wafer" is not limited to a particular form and may be different substrates (e.g., square, round, flat panel).

An insulating layer 130 may be formed on the surface of the wafer 110 and the connection pad 120. The insulating layer 130 may include an opening 135 through which a portion of the connection pad 120 is exposed. The insulating layer 130 may include a photosensitive polyimide (PSPI). An insulating layer 140, including an opening 145 through which a portion of the connection pad 120 may be exposed, may be formed on the insulating layer 130. The insulating layer 140 may be, for example, an inter-level insulating layer.

A rewiring line (150 and/or 155), which is connected to the connection pad 120 through the opening 145, may be disposed on the insulating layer 140. The rewiring line may include a lower rewiring layer 150 formed on the insulating layer 140 and an upper rewiring layer 155 formed on the lower rewiring layer 150. The lower rewiring layer 150 may increase the adhesion between the upper rewiring layer 155 and the connection pad 120. The lower rewiring layer 150 may include, for example, a Ti/Cu layer. The upper rewiring layer 155 may include, for example, a Au or Cu/Ni/Au layer.

A connection pad 160 may be formed on the upper rewiring layer 155 of the rewiring line (150 and/or 155). The connection pad 160 may be conductive and may include a solderable material (e.g., a metal, for example, Au, Ag, or Ni). An insulating layer 170 may be formed on the insulating layer 140, the rewiring line (150 and/or 155), and/or the connection pad 160. The insulating layer 170 may include an opening 175 through which a portion of the connection pad 160 is exposed. The insulating layer 170 may be, for example, an inter-level insulating layer. The connection terminal 180 may be disposed on the connection pad 160 exposed by the opening 175. The connection terminal 180 may conductively connect, for example, electrically connect, the semiconductor chip 100 to an external device (not shown).

The connection terminal 180 may have different structures or shapes according to example embodiments. For example, the connection terminal 180 may have a wire ball shape. The connection terminal 180 may have a structure including one or more entangled wires 181 and a coating film 182 that is formed on the one or more entangled wires 181. The one or more entangled wires 181 may be conductive wires, for example, metal wires. The one or more entangled wires 181 may be, for example, formed of an insulating material (e.g. resin or ceramic) and coated by the coating film 182 that is formed of a conductive material, for example, an electrically conductive material. The coating film 182 may include, for example, a solderable material.

Figure 2:
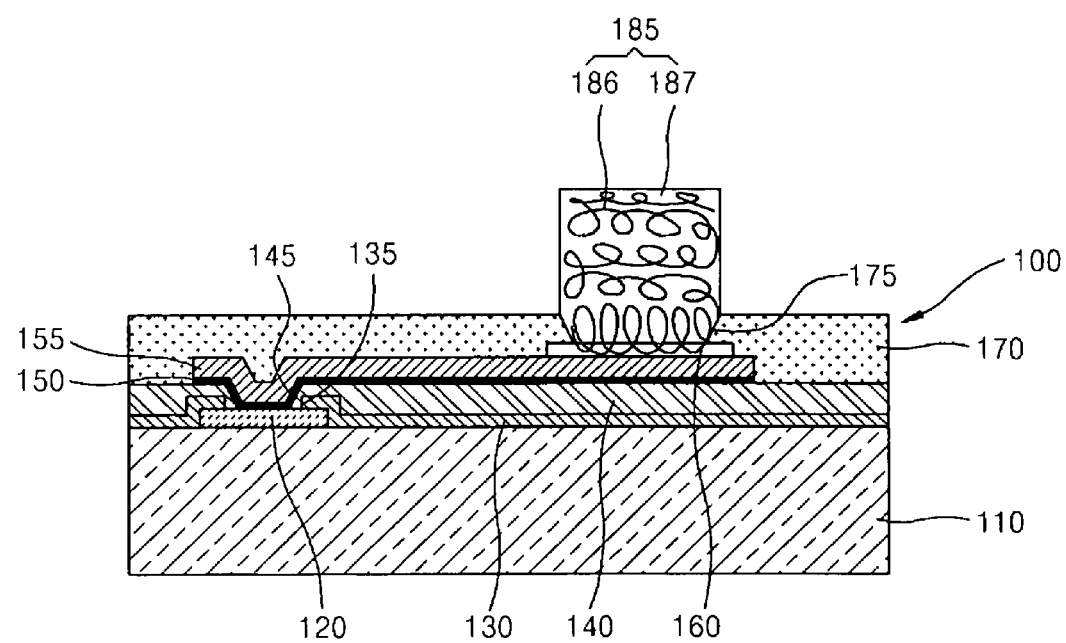

FIG. 2 is a cross-sectional view of a semiconductor package according to example embodiments. Referring to FIG. 2, the semiconductor package may include a semiconductor chip 100 and a connection terminal 185. The semiconductor chip 100 may have the same configuration as the semiconductor chip 100 illustrated in FIG. 1. The connection terminal 185 may have a wire bump shape. The connection terminal 185 may have a structure in which one or more entangled wires 186 are embedded in a bump 187. The one or more entangled wires 186 may be conductive wires (e.g. metal) and/or insulating wires (e.g. resin or ceramic). The one or more entangled wires 186 may be embedded in the bump 187. The bump 187 may be a conductive bump. The bump 187 may include a solder bump.

Figure 3:
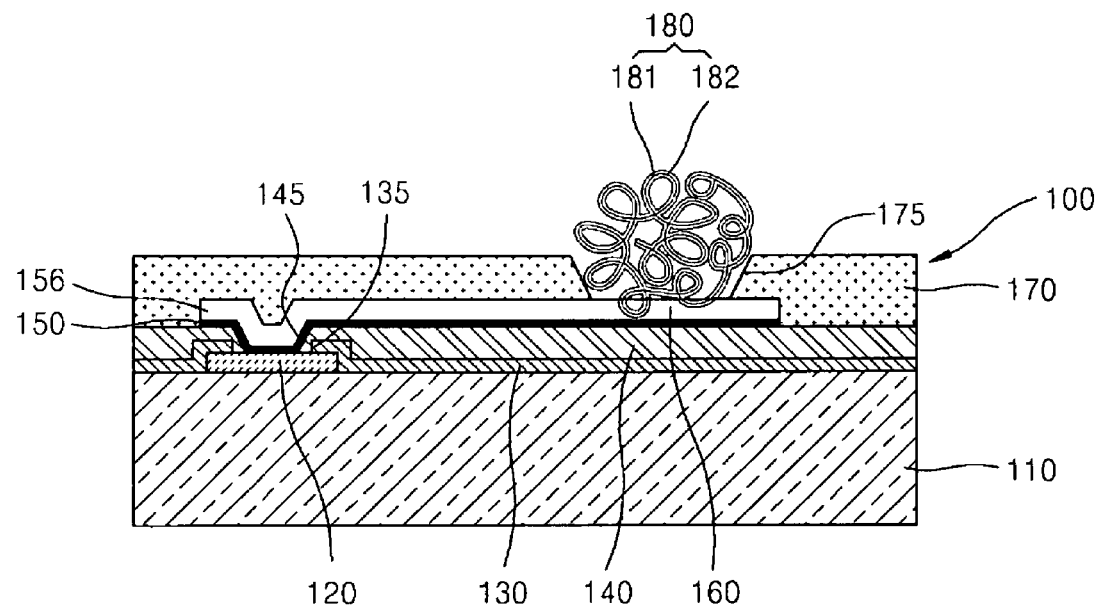

FIG. 3 is a cross-sectional view of a semiconductor package according to example embodiments. Referring to FIG. 3, the semiconductor package may include a semiconductor chip 100 and a connection terminal 180. The connection terminal 180 may have the same configuration as the connection terminal 180 illustrated in FIG. 1.

The semiconductor chip 100 may include a connection pad 120 formed on a surface of a wafer 110. A portion of the connection pad 120 may be exposed by openings 135 and 145 of an insulating layer 130 and an insulating layer 140. A rewiring line may be formed on the insulating layer 140 and include a lower rewiring layer 150 and an upper rewiring layer 156, wherein the lower rewiring layer 150 may be connected to the connection pad 120 through the opening 145, and the upper rewiring layer 156 may be formed on the lower rewiring layer 150. A portion 160 of the upper rewiring layer 156 may be exposed by an opening 175 of an insulating layer 170. The portion 160 of the upper rewiring layer 156, which is exposed by the opening 175, may function as a connection pad. The lower rewiring layer 150 may be a conductive layer and may include, for example, a Ti/Cu layer. The upper rewiring layer 156 may be a conductive layer, for example, a solderable metal layer (e.g. Ag, Au or Ni). The connection terminal 180 having a wire ball shape may be disposed directly on the portion 160 of the upper rewiring layer 156 exposed by the opening 175.

Figure 4:
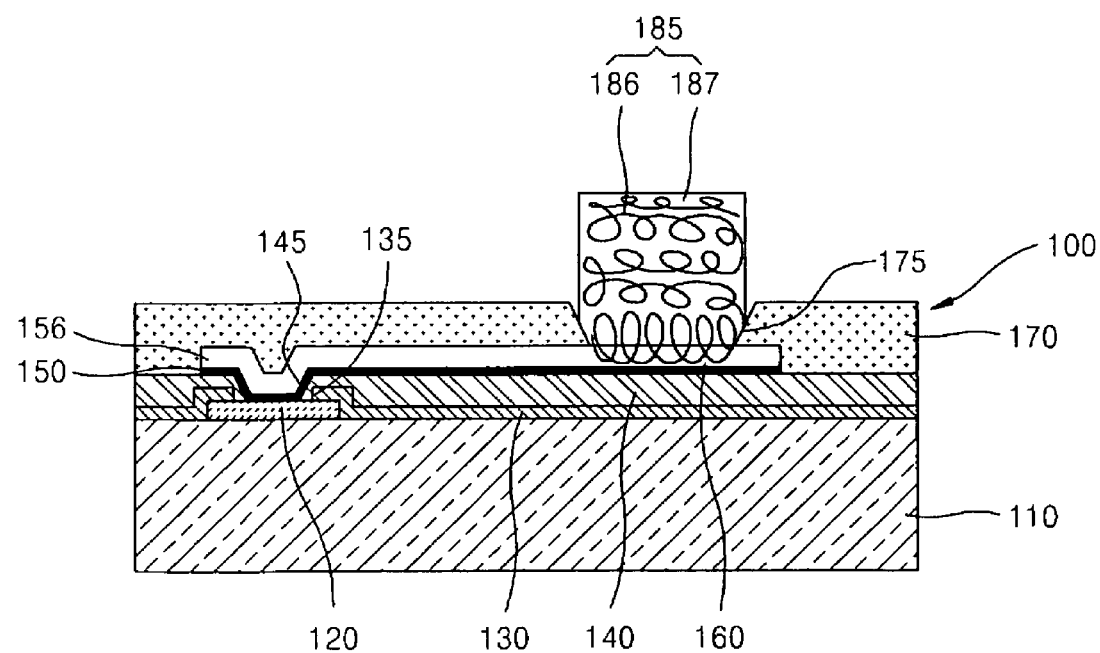

FIG. 4 is a cross-sectional view of a semiconductor package according to example embodiments. Referring to FIG. 4, the semiconductor package may include a semiconductor chip 100 and a connection terminal 185. The connection terminal 185 may have the same configuration as the connection terminal 185 illustrated in FIG. 2. The semiconductor chip 100 may have the same configuration as the semiconductor chip 100 illustrated in FIG. 3. Thus, an upper rewiring layer 156 of a rewiring line may include a solderable material, and the connection terminal 185 having a wire bump shape may be disposed directly on a portion 160 of the upper rewiring layer 156.

Figure 5A:
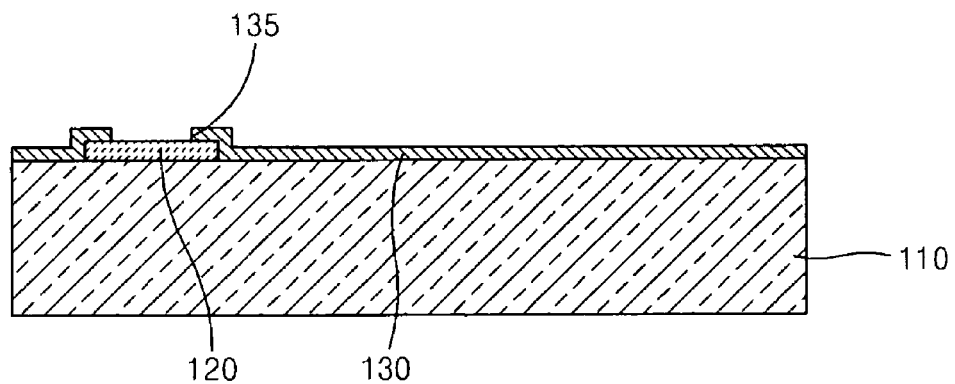
FIGS. 5A through 5I are cross-sectional views for explaining a method of fabricating the semiconductor package of FIG. 1 according to example embodiments.

FIGS. 5A through 5I are cross-sectional views for explaining a method of fabricating the semiconductor package of FIG. 1, according to example embodiments. Referring to FIG. 5A, the connection pad 120 may be formed on a surface of the wafer 110. The surface of the wafer 110 refers to a surface on which semiconductor devices may be formed. The connection pad 120 may be a conductive pad (e.g. a metal pad made of Al). The insulating layer 130 may be formed, for example, of photosensitive polyimide (PSPI) on the connection pad 120 and the surface of the wafer 110. The opening 135 through which a portion of the connection pad 120 may be exposed, may be formed by, for example, etching the insulating layer 130.

Figure 5B:
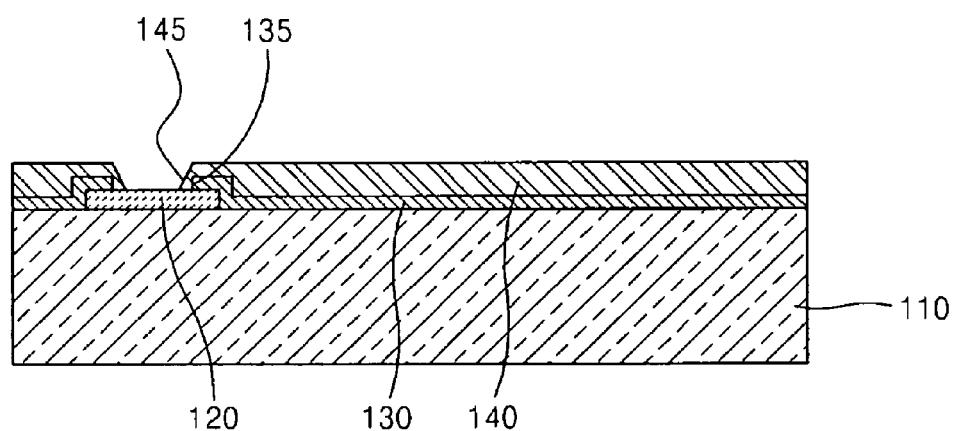
Figure 5C:
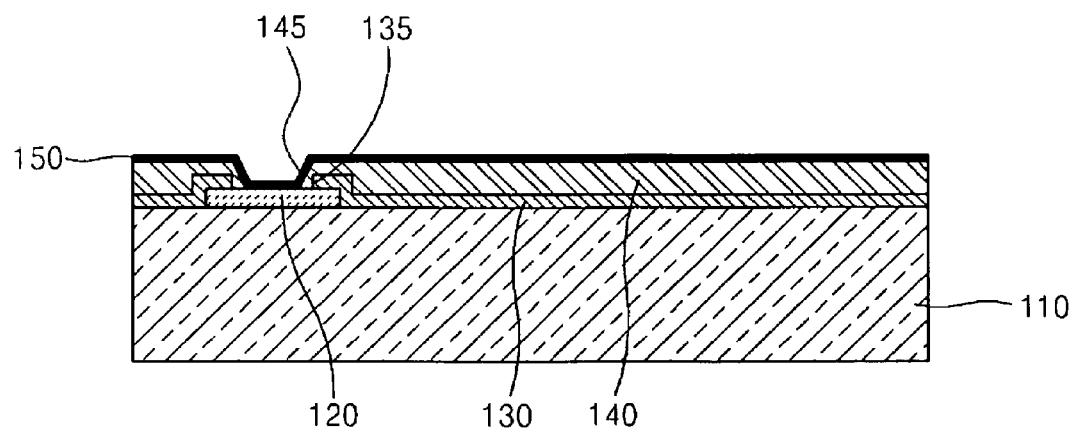

Referring to FIG. 5B, the insulating layer 140 may be formed on the exposed portion of the connection pad 120 and the insulating layer 130. The opening 145 through which a portion of the connection pad 120 is exposed may be formed by, for example, etching the insulating layer 140. The insulating layer 140 may be an inter-level insulating layer. Referring to FIG. 5C, the lower rewiring layer 150 may be formed on the insulating layer 140 and the exposed portion of the connection pad 120.

Figure 5D:
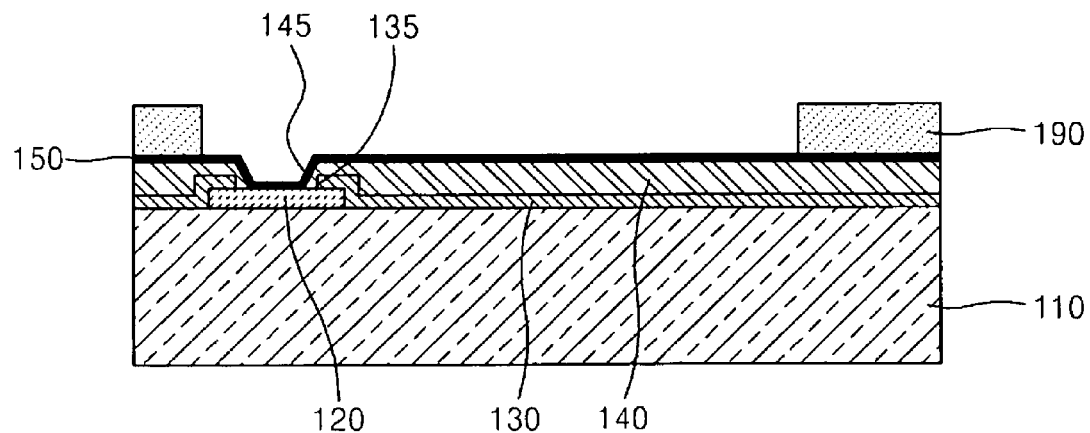
Figure 5E:
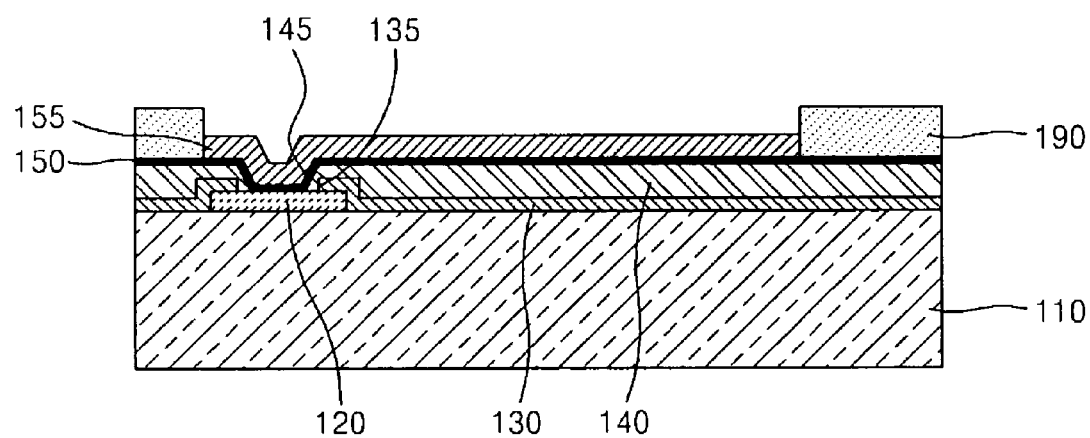

Referring to FIG. 5D, a photosensitive layer 190 may be formed on the lower rewiring layer 150. The photosensitive layer 190 may be formed on the lower rewiring layer 150 so as to expose a portion of the lower rewiring layer 150 corresponding to an upper rewiring layer 155. Referring to FIG. 5E, the upper rewiring layer 155 may be formed on the exposed portion of the lower rewiring layer 150 by, for example, plating while using the photosensitive layer 190 as a mask.

Figure 5F:
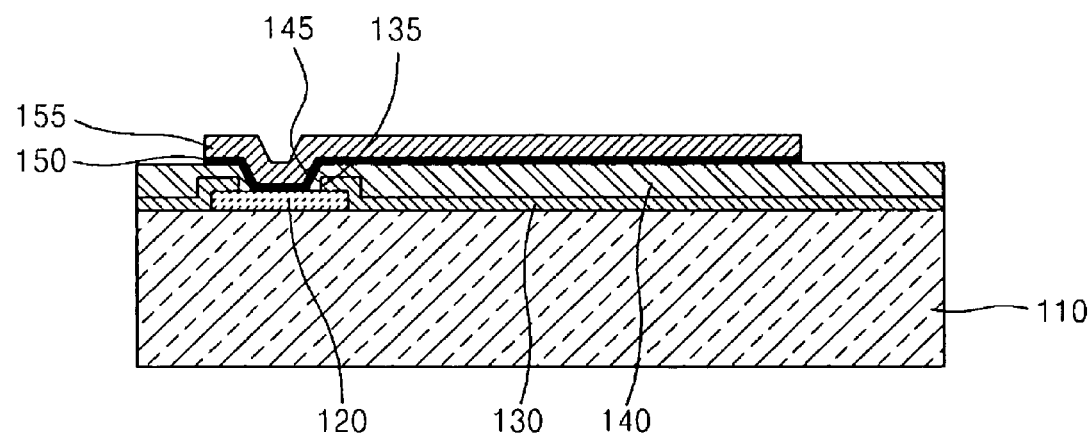
Figure 5G:
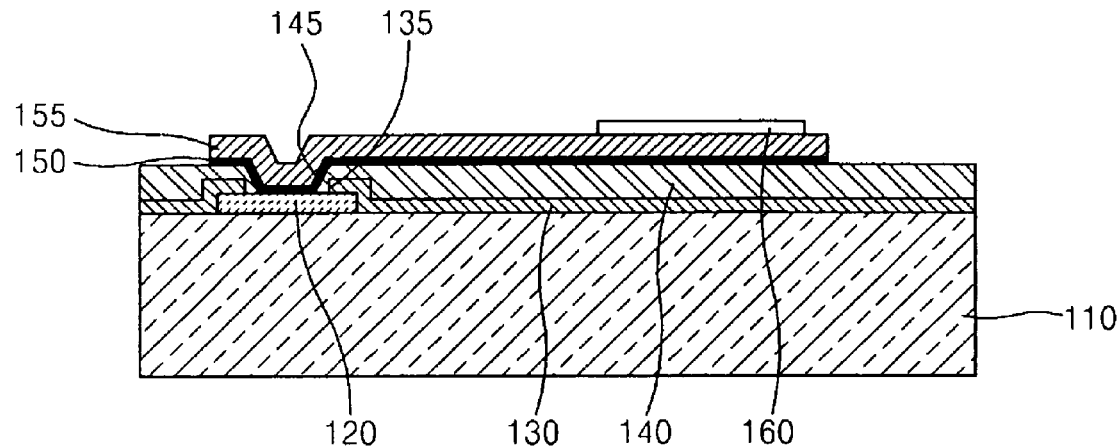

Referring to FIG. 5F, the photosensitive layer 190 may be removed. By removing the photosensitive layer 190, a portion of the lower rewiring layer 150 may be exposed (not shown). Referring to FIGS. 5F and 5G, the exposed portion of the lower rewiring layer 150 may be removed, thereby obtaining a rewiring line including the lower rewiring layer 150 and the upper rewiring layer 155. The connection pad 160 may be formed on the upper rewiring layer 155. The connection pad 160 may be formed by depositing and patterning a solderable material on the upper rewiring layer 155.

Figure 5H:
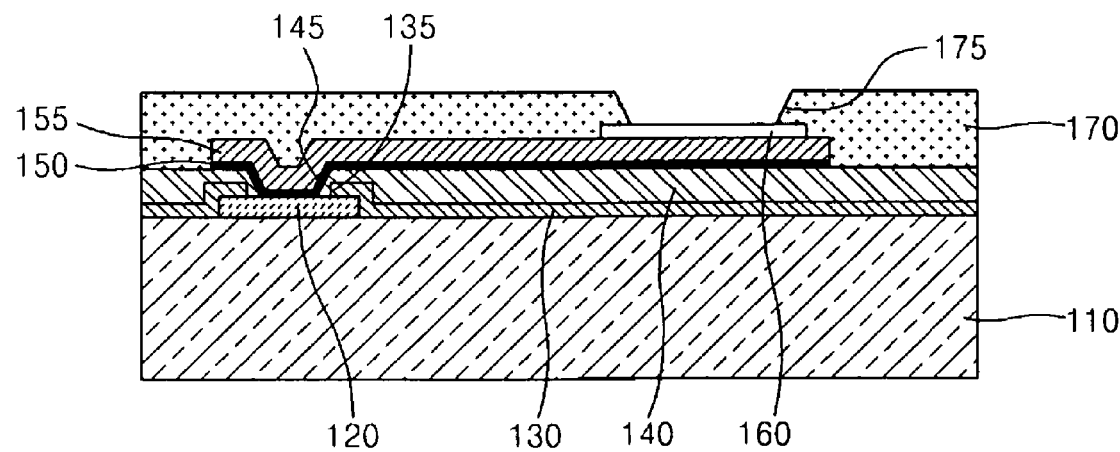

Referring to FIG. 5H, the insulating layer 170 may be formed on the connection pad 160, the rewiring line (155 and 150) and the insulating layer 140. The insulating layer 170 may include an inter-level insulating layer. The opening 175 through which the portion of the connection pad 160 is exposed may be formed by etching the insulating layer 170.

Figure 5I:
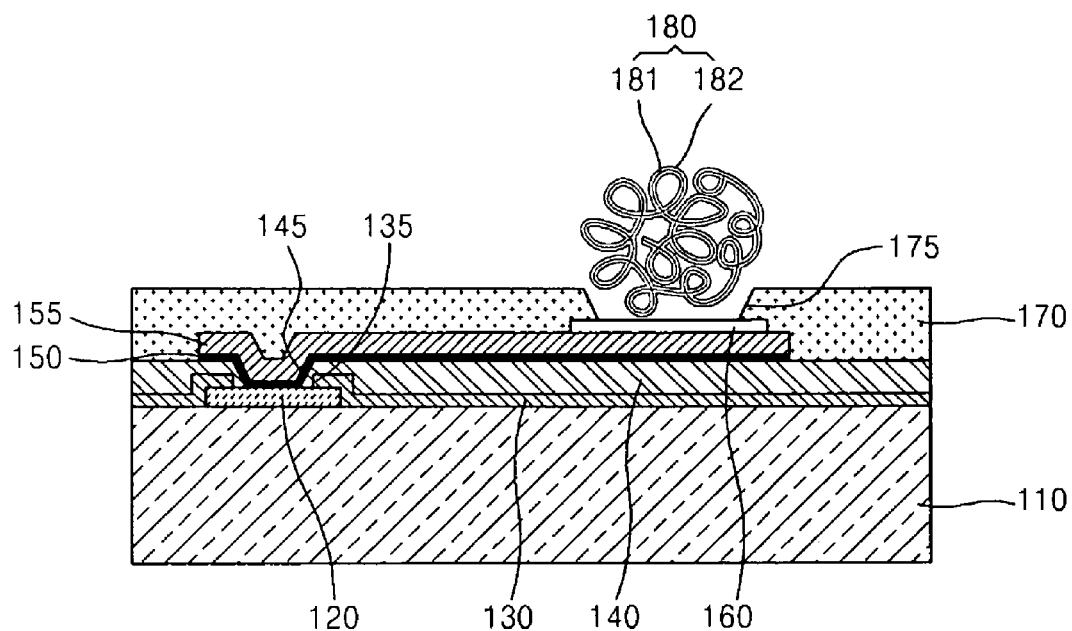

Referring to FIG. 5I, the one or more entangled wires 181 entangled in a ball shape may be disposed on the exposed portion of the connection pad 160. When a reflow process is performed, the connection pad 160 may be reflowed so that a solderable material flows along the one or more entangled wires 181. Thus, the coating film 182 may be formed on the surface of the one or more entangled wires 181 and the one or more entangled wires 181 may penetrate into the connection pad 160, as illustrated in FIG. 1.

In example embodiments, the one or more entangled wires 181 coated by the coating film 182 may be prepared, the one or more entangled wires 181 coated by the coating film 182 may be disposed on the exposed portion of the connection pad 160, and a reflow process may be performed so that the one or more entangled wires 181 may penetrate into the connection pad 160. Thus, the connection terminal 180 may be disposed on the connection pad 160 so as to be conductively connected to the upper rewiring layer 155, for example, electrically connected.

A portion of the one or more entangled wires 181 of the connection terminal 180 that is penetrated into the connection pad 160, may be perpendicularly disposed to a surface of the wafer 110. In addition, the thickness of the connection pad 160 may be determined according to the size of the connection terminal 180. By adjusting the length, material and degree of entanglement of the one or more entangled wires 181 of the connection terminal 180, the arrangement of the connection terminal 180 may be controlled. The connection terminal 180 may be formed by entangling a single wire or a plurality of wires. The plurality of wires may be individually entangled. Two or more of the plurality of wires may be entangled with each other. Two or more of the plurality of wires may be individually entangled and entangled with each other. Two or more of the plurality of wires may be individually entangled, entangled with each other, or individually entangled and entangled with each other. Any entanglement or combination of entanglements may be possible.

Figure 6A:
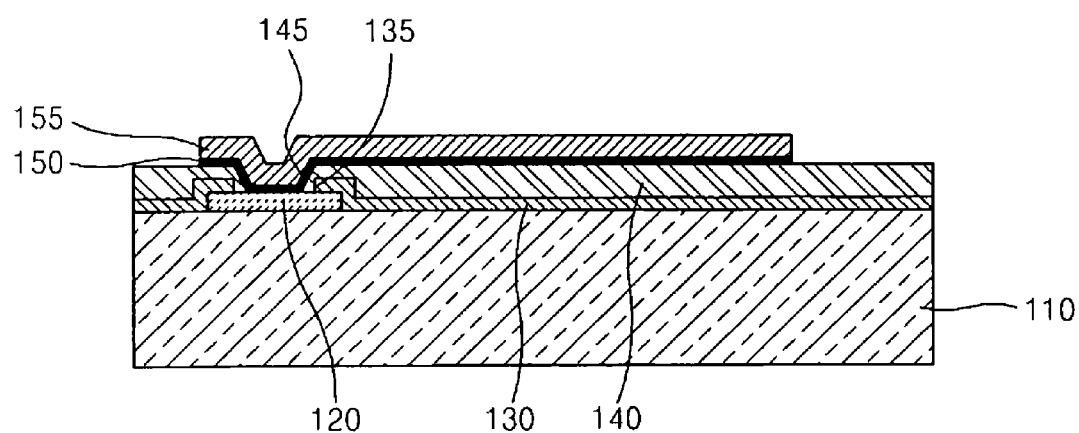
FIGS. 6A through 6C are cross-sectional views for explaining a method of fabricating the semiconductor package of FIG. 2 according to example embodiments.
Figure 6B:
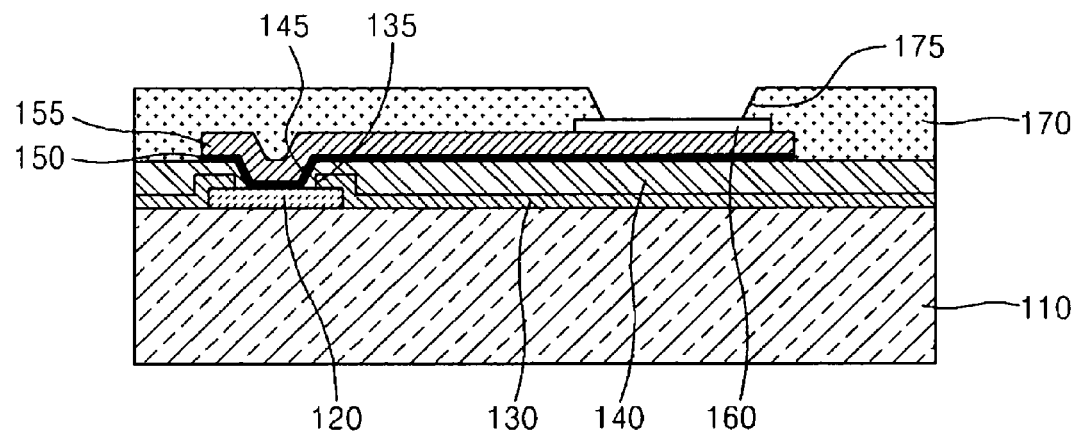
Figure 6C:
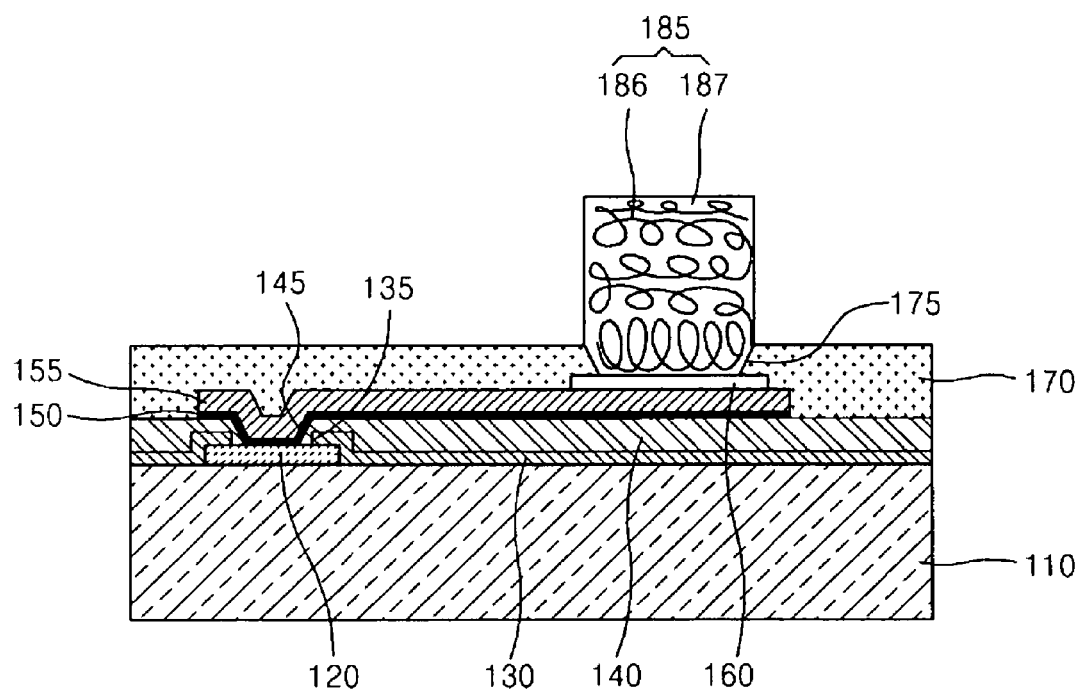

FIGS. 6A through 6C are cross-sectional views for explaining a method of fabricating the semiconductor package of FIG. 2, according to example embodiments. Referring to FIG. 6A, the rewiring line including the lower rewiring layer 150 and the upper rewiring layer 155 may be formed on the wafer 110 by the same method described in relation to FIGS. 5A through 5F. Referring to FIG. 6B, the insulating layer 170 having the opening 175 through which the portion of the connection pad 160 is exposed may be formed on the connection pad 160, the rewiring line (150 and 155) and the insulating layer 140.

Referring to FIG. 6C, the connection terminal 185 is provided. The connection terminal 185 may have a bump shape in which the one or more entangled wires 186 may be embedded in a solderable material 187. The connection terminal 185 may be disposed and reflowed on the exposed portion of the connection pad 160. The one or more entangled wires 186 may permeate into the connection pad 160, as illustrated in FIG. 2.

Figure 7A:
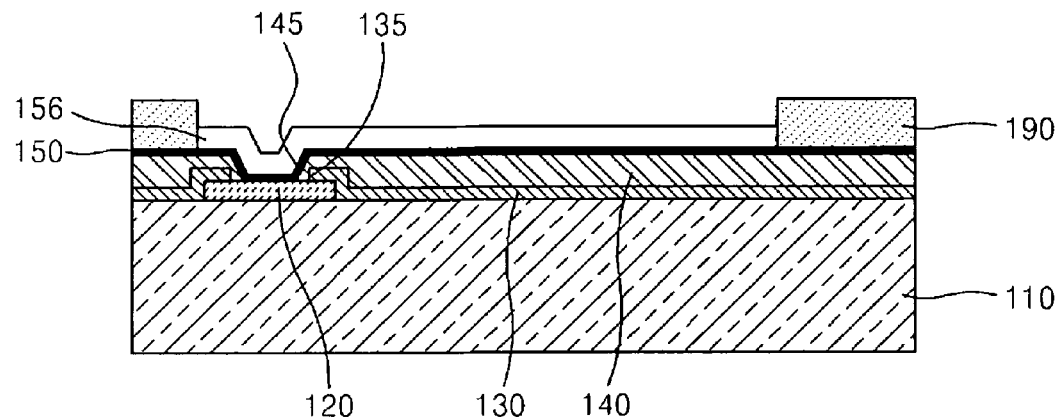
FIGS. 7A through 7D are cross-sectional views for explaining a method of fabricating the semiconductor package of FIG. 3 according to example embodiments.

FIGS. 7A through 7D are cross-sectional views for explaining a method of fabricating the semiconductor package of FIG. 3, according to example embodiments. Referring to FIG. 7A, by the same method described in relation to FIGS. 5A through 5D, the lower rewiring layer 150 connected to the exposed portion of the connection pad 120 may be formed on the insulating layer 140 and the photosensitive layer 190 may be formed on the lower rewiring layer 150 so as to expose a portion of the lower rewiring layer 150, corresponding to the upper rewiring layer 156. The upper rewiring layer 156 may be formed on the exposed portion of the lower rewiring layer 150 by, for example, plating using the photosensitive layer 190 as a mask.

Figure 7B:
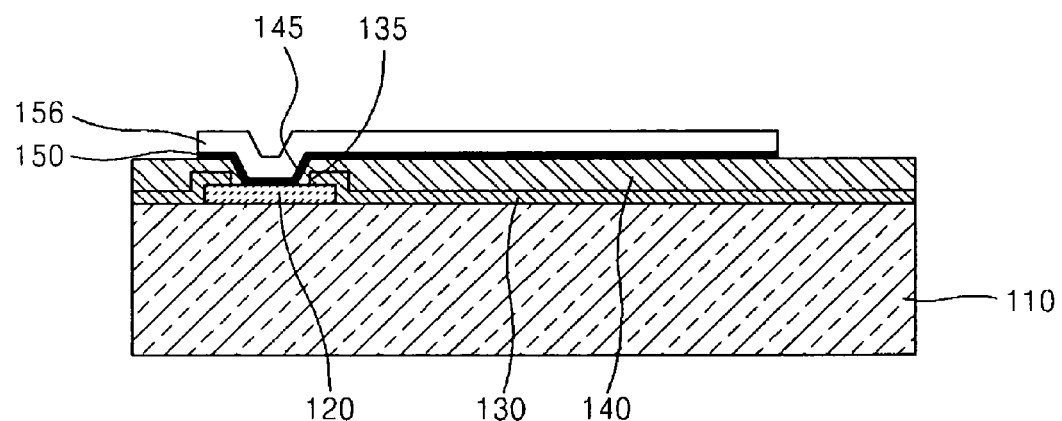
Figure 7C:
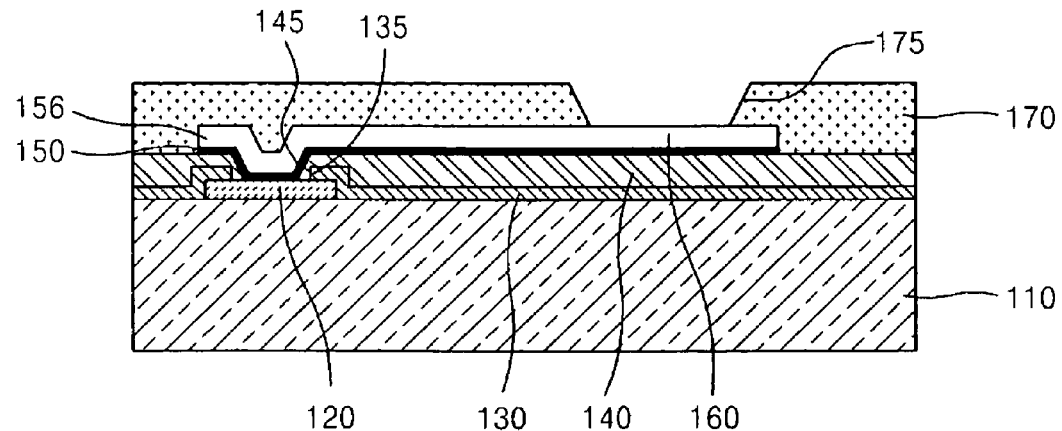

Referring to FIG. 7B, the photosensitive layer 190 may be removed. The rewiring line (150 and 156) may be formed by removing a portion of the lower rewiring layer 150 under the photosensitive layer 190. Referring to FIG. 7C, an insulating layer 170 including the opening 175 through which a portion 160 of the upper rewiring layer 156 is exposed, may be formed on the rewiring line (150 and 156) and the insulating layer 140.

Figure 7D:
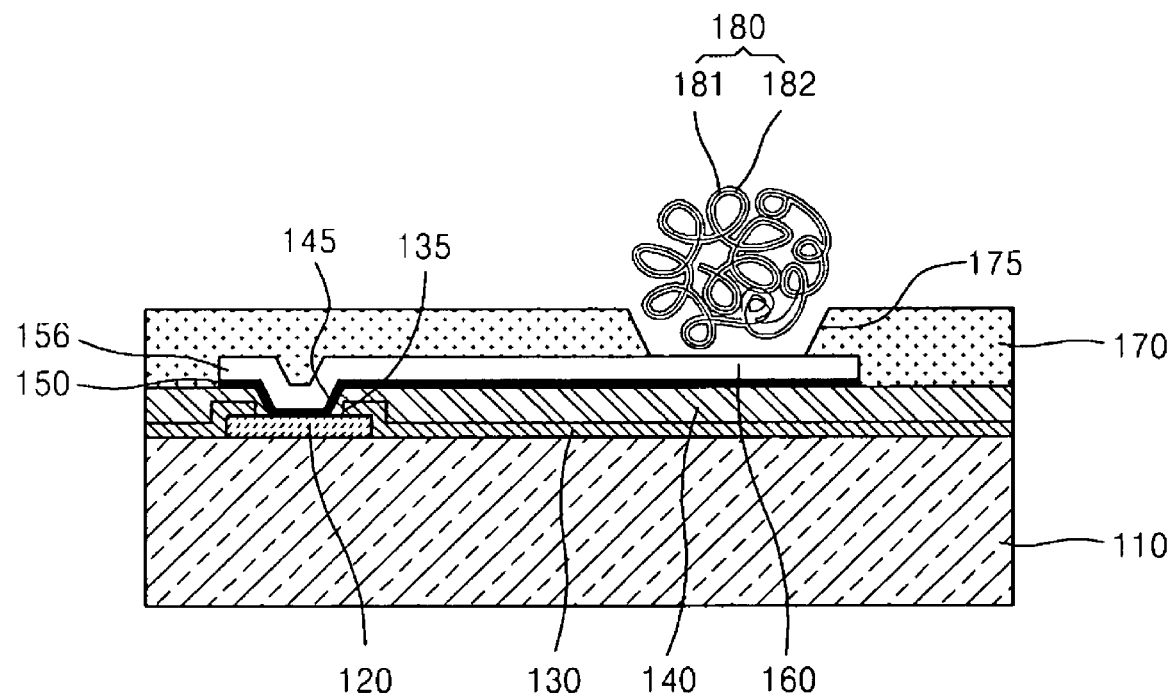

Referring to FIG. 7D, the one or more entangled wires 181 entangled in a ball shape may be disposed on the exposed portion 160 of the upper rewiring line 156, which according to example embodiments, may be made of a solderable material, and a reflow process may be performed. The upper rewiring layer 156 may be reflowed so that a solderable material flows along the one or more entangled wires 181. Thus, the coating film 182 may be formed on the surface of the one or more entangled wires 181, and the one or more entangled wires 181 may permeate into the portion of the upper rewiring layer 156, as illustrated in FIG. 3.

According to example embodiments, the one or more entangled wires 181 coated by the coating film 182 may be prepared, the one or more entangled wires 181 coated by the coating film 182 may be disposed on the exposed portion of the upper rewiring layer, and a reflow process may be performed so that the one or more entangled wires 181 may permeate into the portion 160 of the upper rewiring layer 156 exposed by the opening 175. Thus, the connection terminal 180 may be disposed directly on the upper rewiring layer 156 so as to be conductively connected to the upper rewiring layer 156, for example, electrically connected.

Figure 8A:
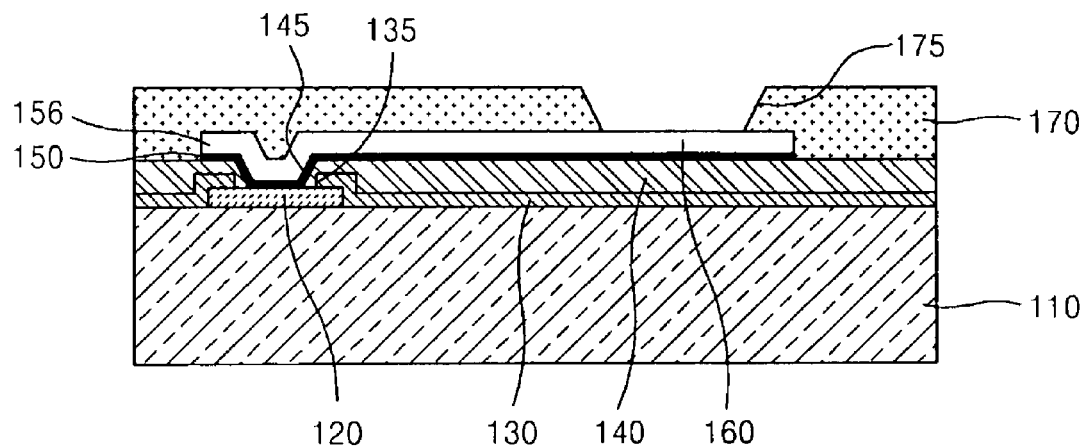
FIGS. 8A and 8B are cross-sectional views for explaining a method of fabricating the semiconductor package of FIG. 4 according to example embodiments.
Figure 8B:
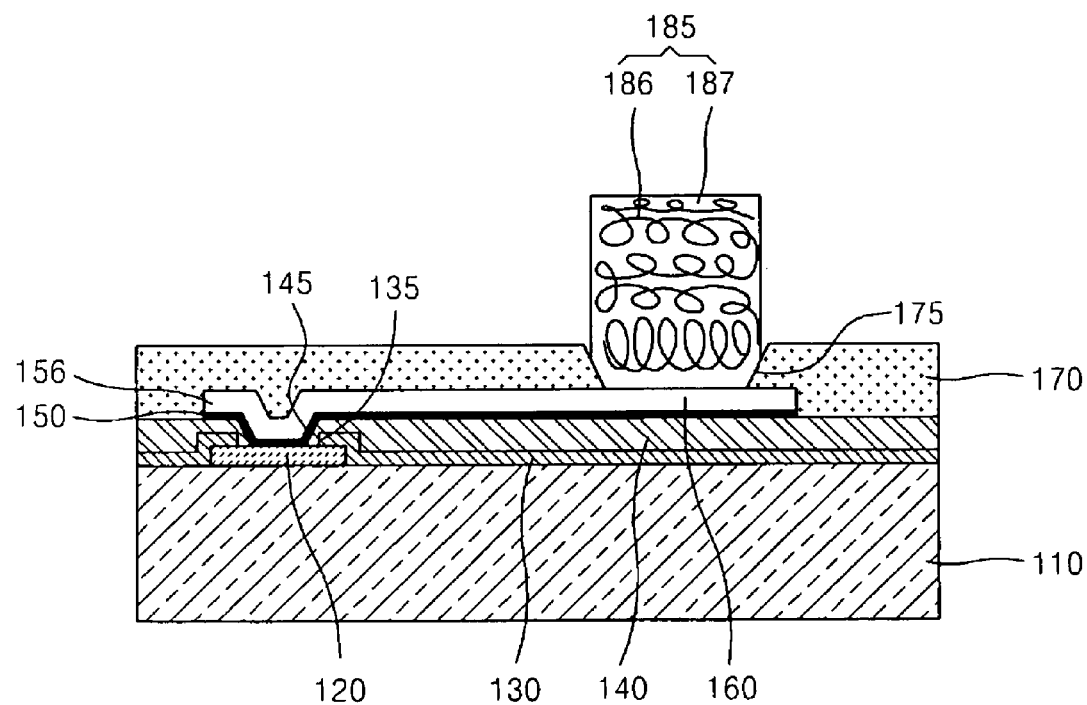

FIGS. 8A and 8B are cross-sectional views for explaining a method of fabricating the semiconductor package of FIG. 4, according to example embodiments. Referring to FIG. 8A, the lower rewiring layer 150 and the upper rewiring layer 156 may be formed of a solderable material and may be formed as the rewiring line, for example as in FIGS. 7A through 7C. The insulating layer 170 including the opening 175 through which the portion 160 of the upper rewiring layer 156 is exposed may be formed on the upper rewiring layer 156 and the insulating layer 140. Referring to FIG. 8B, the connection terminal 185 having a wire bump shape may be disposed and reflowed on the exposed portion 160 of the upper rewiring layer 156. The one or more entangled wires 186 may permeate into the portion 160 of the upper rewiring layer 156, as illustrated in FIG. 4.

Figure 9:
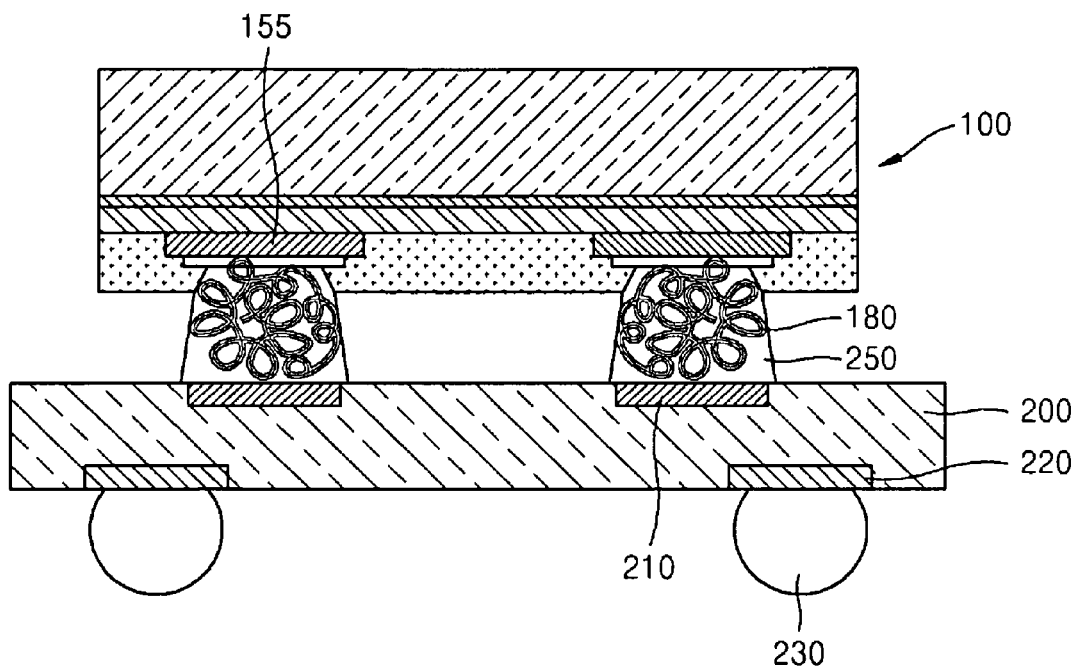

FIG. 9 is a cross-sectional view of a semiconductor package according to example embodiments. The semiconductor package may include a semiconductor chip 100, a connection terminal 180 and a package substrate 200. The packaging substrate 200 may include a plurality of circuit patterns 210 disposed on a surface of the packaging substrate 200, a plurality of circuit patterns 220 disposed on another surface of the packaging substrate 200, and a plurality of external connection terminals 230 disposed on the circuit patterns 220. The semiconductor chip 100 may have the same configuration as that in FIG. 1. The upper rewiring layer 155 of the semiconductor chip 100 may be conductively connected, for example electrically connected, to the circuit patterns 210 through both the connection terminal 180 having a wire ball shape and the connection pad 160.

On the other hand, the upper rewiring layer 155 of the semiconductor chip 100 may be connected to the circuit patterns 210 of the packaging substrate 200 through both the connection terminal 180 having a wire bump shape as illustrated in FIG. 2 and the connection pad 160. The semiconductor package may further include an underfill material 250 covering the connection terminal 180 having a wire ball shape that may improve joint reliability.

Figure 10:
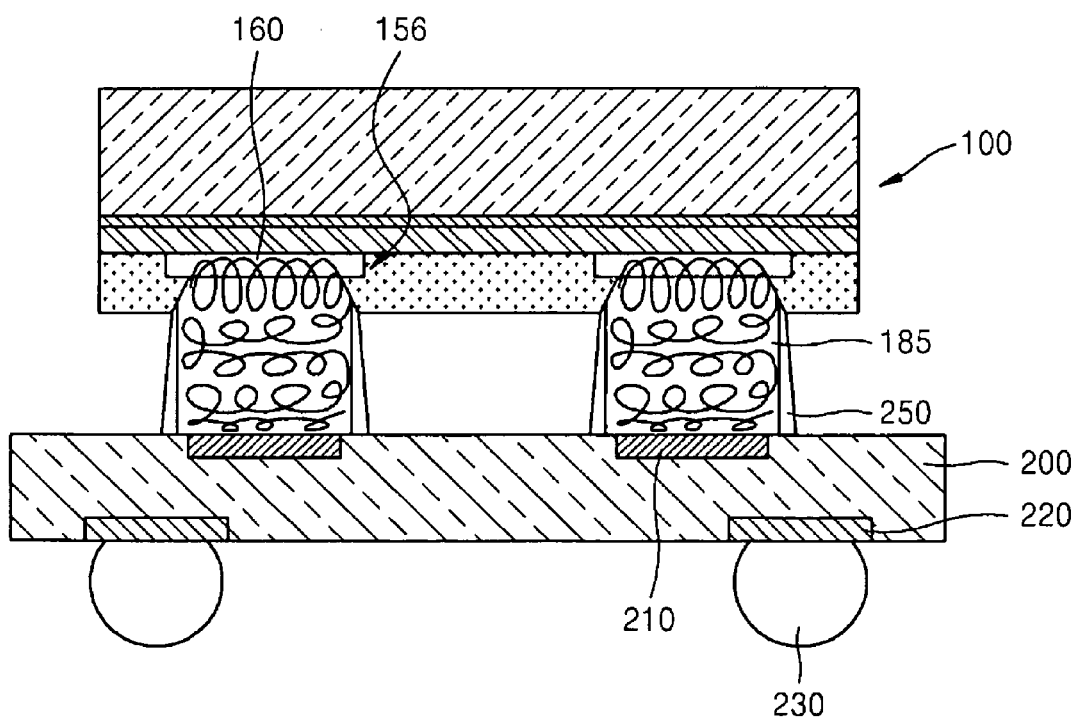

FIG. 10 is a cross-sectional view of a semiconductor package according to example embodiments. The semiconductor package may include a semiconductor chip 100, a connection terminal 185 and a packaging substrate 200. The packaging substrate 200 may have the same configuration as that in FIG. 9, and the semiconductor chip 100 may have the same configuration as that in FIG. 4. A portion 160 of the upper rewiring layer 156 of the semiconductor chip 100 may be conductively connected, for example electrically connected, to the circuit patterns 210 through the connection terminal 185 having a wire bump shape. The portion 160 of the upper rewiring layer 156 of the semiconductor chip 100 may be electrically connected to the circuit patterns 210 of the packaging substrate 200 through the connection terminal 185 having a wire ball shape illustrated in FIG. 3. The semiconductor package may further include an underfill material 250 covering the connection terminal 185 having a wire bump shape.

While example embodiments have been particularly shown and described, it will be understood that various changes in form and details may be made therein without departing from the spirit and scope of the claims.

What is claimed is:
1. A semiconductor package, comprising:
  a first conductive connector on a surface of a semiconductor wafer;
  a first insulating layer on the first conductive connector and the semiconductor wafer and including a first opening through which a portion of the first conductive connector is exposed;
  a rewiring line on the first insulating layer and conductively connected to an exposed portion of the first conductive connector;
  a second insulating layer on the rewiring line and the first insulating layer and including a second opening through which a portion of the rewiring line is exposed; and
  a connection terminal including one or more entangled wires on the exposed portion of the rewiring line and conductively connected to the rewiring line, the one or more entangled wires including an insulating material.

2. The semiconductor package of claim 1, wherein the rewiring line includes a solderable material.

3. The semiconductor package of claim 2, wherein the rewiring line includes a metal that is one of Ag, Au and Ni.

4. The semiconductor package of claim 1, wherein the rewiring line includes:
  a lower rewiring layer on the first insulating layer and connected to the exposed portion of the first conductive connector; and
  an upper rewiring layer on the lower rewiring layer,
  wherein the upper rewiring layer includes a solderable material.

5. The semiconductor package of claim 1, further comprising:
  a second conductive connector, wherein a portion of the second conductive connector is between the connection terminal and the rewiring line and the connection terminal is conductively connected to the rewiring line.

6. The semiconductor package of claim 5, wherein the second conductive connector includes a solderable material.

7. The semiconductor package of claim 6, wherein the solderable material includes one of Ag, Au and Ni or a combination thereof.

8. The semiconductor package of claim 7, wherein the rewiring line comprises:
  a lower rewiring layer on the first insulating layer and connected to the exposed portion of the first conductive connector; and
  an upper rewiring layer on the lower rewiring layer.

9. The semiconductor package of claim 1, wherein the one or more entangled wires include at least one of a resin and a ceramic material.

10. The semiconductor package of claim 9, wherein the connection terminal includes a wire ball including the one or more entangled wires coated with a conductive material,
   the one or more entangled wires of the wire ball penetrate into the rewiring line, and
   the coating of the entangled wires includes a same material as the rewiring line.

11. The semiconductor package of claim 10, wherein the conductive material includes a solderable material.

12. The semiconductor package of claim 9, wherein the connection terminal includes a wire bump in which the one or more entangled wires are embedded, and
   the one or more entangled wires of the wire bump penetrate into the rewiring line.

13. The semiconductor package of claim 12, wherein the wire bump includes a solderable material.

14. The semiconductor package of claim 13, wherein the solderable material is one of Ag, Au and Ni or a combination thereof.

15. The semiconductor package of claim 1, wherein the one or more entangled wires include a plurality of entangled wires, and
   the plurality of entangled wires are either individually entangled or two or more of the plurality of wires are entangled with each other.

16. The semiconductor package of claim 1, wherein the one or more entangled wires include a plurality of entangled wires, and
   two or more of the plurality of entangled wires are both individually entangled and entangled with each other.

17. The semiconductor package of claim 8, wherein the connection terminal includes a wire ball including the one or more entangled wires coated with the solderable conductive material,
   the one or more entangled wires of the wire ball penetrate into the second conductive connector, and
   the coating of the one or more entangled wires is a same material as the second conductive connector.

18. The semiconductor package of claim 8, wherein the connection terminal includes a wire bump in which the one or more entangled wires are embedded, and
   the one or more entangled wires of the wire bump penetrate into the second conductive connector.

19. The semiconductor package of claim 8, wherein the upper rewiring layer includes one of Au, Cu, and Ni or a combination thereof, and
   the lower rewiring layer includes one of Ti and Cu or a combination thereof.

* * * * *